United States Patent [19]
Belcher et al.

[11] Patent Number: 5,426,304
[45] Date of Patent: Jun. 20, 1995

[54] INFRARED DETECTOR THERMAL ISOLATION STRUCTURE AND METHOD

[75] Inventors: James F. Belcher, Plano; Robert A. Owen, Rowlett; Charles M. Hanson; Howard R. Beratan, both of Richardson, all of Tex.

[73] Assignee: Texas Instruments Incorporated, Dallas, Tex.

[21] Appl. No.: 182,865

[22] Filed: Jan. 13, 1994

[51] Int. Cl.[6] .............................................. G01J 5/06
[52] U.S. Cl. ................... 250/332; 250/338.2
[58] Field of Search ............. 250/332, 352, 338.2, 250/338.3, 349, 370.08

[56] References Cited

U.S. PATENT DOCUMENTS

| | | | |
|---|---|---|---|
| 3,962,578 | 6/1976 | Roschen | 250/226 |
| 4,085,500 | 4/1978 | Hager et al. | 29/589 |
| 4,411,732 | 10/1983 | Wotherspoon | 156/643 |
| 4,447,291 | 5/1984 | Schulte | 156/643 |
| 4,614,957 | 9/1986 | Arch et al. | 357/16 |
| 4,639,756 | 1/1987 | Rosbeck et al. | 357/30 |
| 4,684,812 | 8/1987 | Tew et al. | 250/578 |
| 4,740,700 | 4/1988 | Shaham et al. | 250/349 |
| 4,948,976 | 8/1990 | Baliga et al. | 250/370 |
| 4,965,649 | 10/1990 | Zanio et al. | 357/301 |
| 5,113,076 | 5/1992 | Schulte | 250/370 |
| 5,144,138 | 9/1992 | Kinch et al. | 250/332 |
| 5,188,970 | 2/1993 | York et al. | 437/3 |

Primary Examiner—Carolyn E. Fields
Attorney, Agent, or Firm—Brian A. Carlson; James C. Kesterson; Richard L. Donaldson

[57] ABSTRACT

In an exemplary thermal imaging system (20, 120, 220 and 320), a thermal isolation structure (50 and 150) is disposed on an integrated circuit substrate (70 and 170) for electrically connecting and mechanically bonding a corresponding focal plane array (30, 130, and 230) of thermal sensors (40, 140, and 240). Each mesa-type structure (52, 54 and 152) includes at least one mesa conductor (56, 58, 156 and 158) that extends from the top of the mesa-type structure (52, 54 and 152) to an adjacent contact pad (72 and 74). The mesa conductors (56, 58, 156 and 158) provide both biasing voltage ($V_B$) for the respective thermal sensor (40 and 240) and a signal flowpath ($V_s$) for the respective thermal sensor (40 and 240). The mesa conductors (56, 58, 156 and 158) may be used to provide biasing voltage ($V_B$) to either a single ferroelectric element (242 and 243) having a void space (277 and 279) or a pair of ferroelectric elements (42 and 44). When the focal plane array (30, 130 and 230) is bonded to the corresponding array of mesa-type structures (52, 54 and 152), a thermally isolated, but electrically conductive path is provided between electrodes (43 and 45) of the thermal sensor (40 and 240) and the corresponding contact pad (72 and 172) of the integrated circuit substrate (70 and 74).

20 Claims, 4 Drawing Sheets

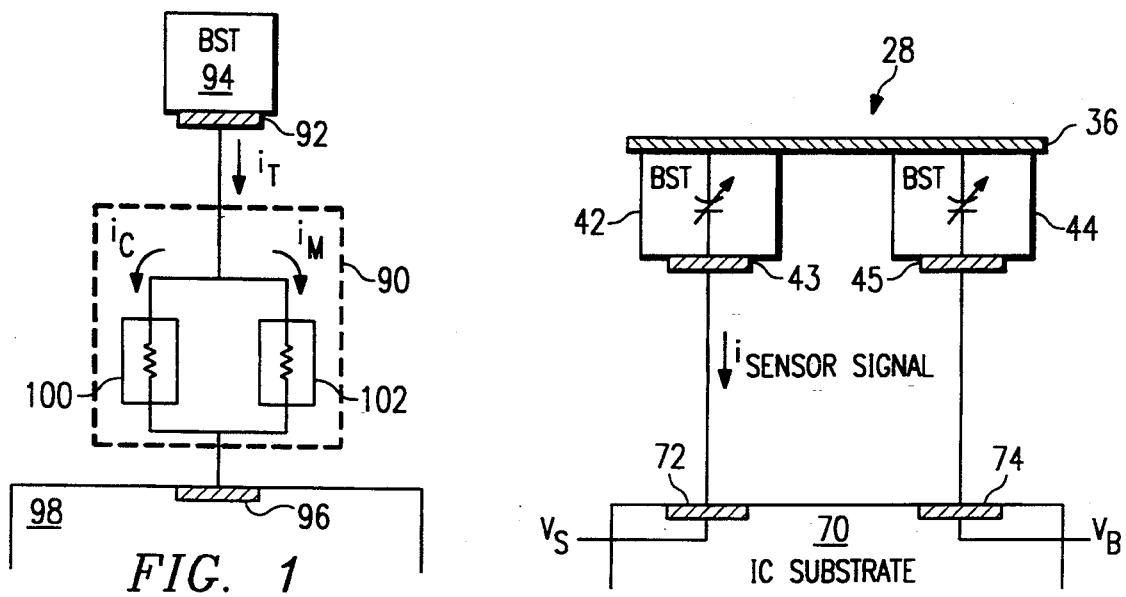
FIG. 1 (PRIOR ART)
FIG. 2
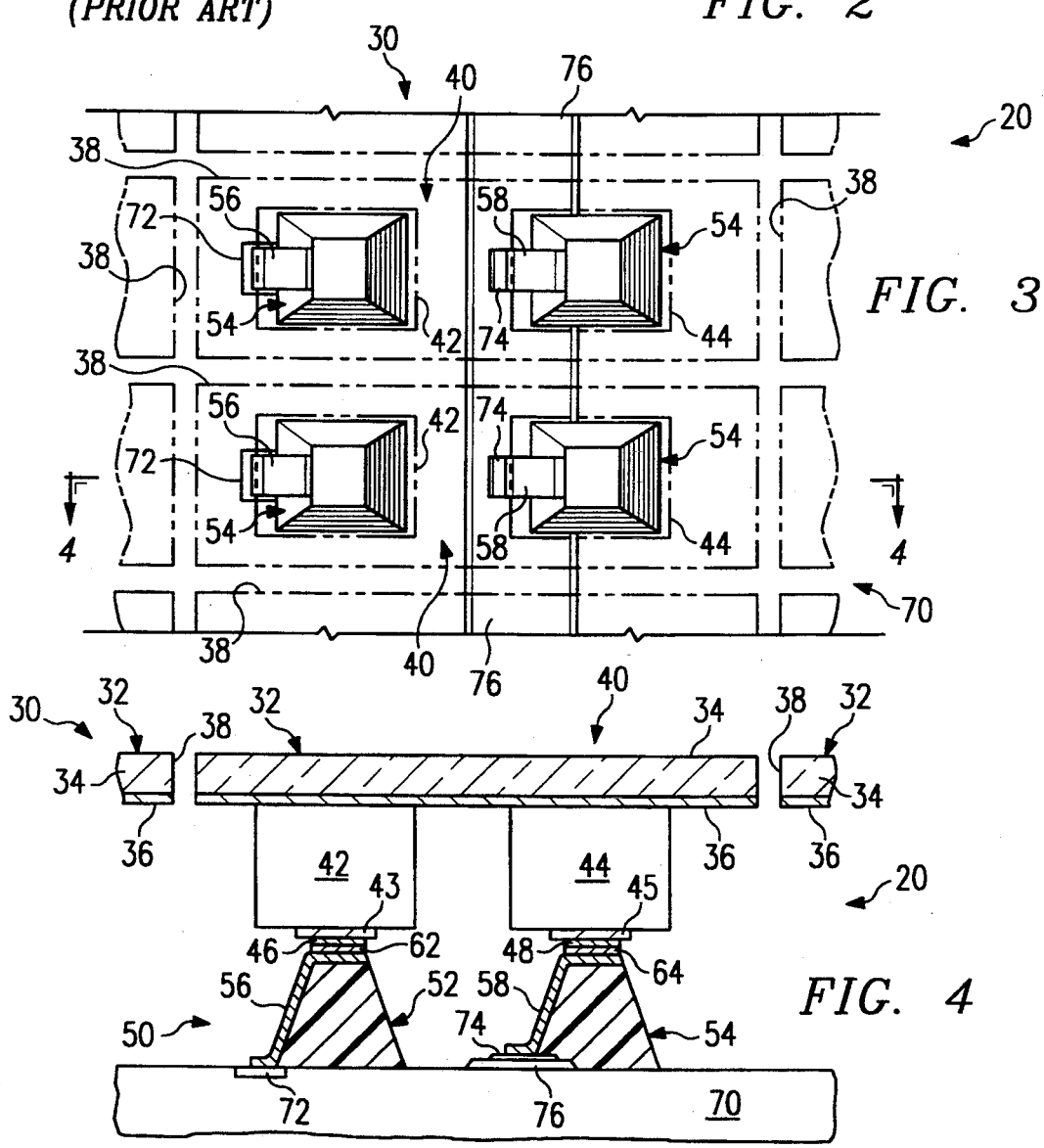
FIG. 3
FIG. 4

INFRARED DETECTOR THERMAL ISOLATION STRUCTURE AND METHOD

RELATED APPLICATIONS

This application is related to co-pending application Serial No. 08/182,268 filed on Jan. 13, 1994, entitled Infrared Detector and Method, of the same assignee.

TECHNICAL FIELD OF THE INVENTION

This invention relates to thermal isolation and signal flowpaths for hybrid solid state systems, and more particularly, to a thermal (infrared) imaging system having a mesa-type structure and method for providing mechanical and electrical bonds between a focal plane array of thermal sensors and an underlying integrated circuit substrate.

BACKGROUND OF THE INVENTION

One common application of thermal sensors is in thermal (infrared) imaging devices such as night vision equipment. One such class of thermal imaging devices includes a focal plane array of infrared detector elements or thermal sensors coupled to an integrated circuit substrate with a corresponding array of contact pads between the focal plane array and the integrated circuit substrate. The thermal sensors define the respective picture elements (or pixels) of the resulting thermal image.

One type of thermal sensor includes a ferroelectric or pyroelectric element formed from ferroelectric material which exhibits a state of electrical polarization dependent upon temperature changes in response to incident infrared radiation. An infrared absorber and common electrode are disposed on one side of the ferroelectric elements. A sensor signal electrode is disposed on the opposite side of each ferroelectric element. The infrared absorber and common electrode extend across the surface of the focal plane array and are attached to each of the ferroelectric elements. Each ferroelectric element generally has its own separate sensor signal electrode. Each infrared detector element or thermal sensor is defined in part by the infrared absorber and common electrode and the respective sensor signal electrode. The electrodes constitute capacitive plates and the ferroelectric element constitutes a dielectric or insulator disposed between the capacitive plates.

Thermal isolation structures are typically disposed between the focal plane array and the integrated circuit substrate to provide both mechanical bonding and a sensor signal flowpath while minimizing thermal diffusion from the respective thermal sensors to the integrated circuit substrate. Several approaches have been used to provide such thermal isolation structures for isolating an array of thermal sensors from an underlying integrated circuit substrate. Examples of such thermal isolation structures are shown in U.S. Pat. No. 4,143,269 entitled *Ferroelectric Imaging System* to McCormack, et al., and U.S. Pat. No. 5,047,644 entitled *Polyimide Thermal Isolation Mesa for a Thermal Imaging System* to Meissner, et al., both assigned to Texas Instruments Incorporated, the assignee of this invention.

SUMMARY OF THE INVENTION

In accordance with the present invention, the disadvantages and problems associated with previous focal plane arrays and thermal isolation structures used to mechanically and electrically couple an array of thermal sensors to an integrated circuit substrate have been substantially reduced or eliminated. The present invention allows fabricating a thermal (infrared) imaging system having enhanced thermal isolation by coupling an array of thermal sensors with an array of mesa-type structures disposed between the thermal sensors and the integrated circuit substrate.

The present invention improves mechanical and electrical coupling between component structures of a hybrid solid state system by providing relatively robust mesa-type structures for use during bonding of the component structures and multiple electrical conductors between the component structures. The mesa-type structures may be formed on and project from one of the component structures of the hybrid system.

An important technical advantage of the present invention includes improved thermal isolation between adjacent thermal sensors by eliminating the need for a common metal plate as part of the associated infrared absorber assembly to contact each thermal sensor. The present invention results in substantially reduced thermal current flow between pixels and minimizes any loss in the Modulation Transfer Function (MTF) associated with each thermal sensor.

In one aspect of the present invention, the thermal isolation structure may be used in a thermal imaging system to couple an array of thermal sensors to an integrated circuit substrate having a corresponding array of contact pads on the surface of the integrated circuit substrate adjacent to the mesa-type structures formed between each thermal sensor and the integrated circuit substrate. Each mesa-type structure includes one or more mesa conductors for providing signal paths from the top of each mesa to the associated contact pads. A focal plane array may be disposed over the integrated circuit substrate in contact with the respective mesa-type structures such that, for each thermal sensor, biasing voltage ($V_B$) is coupled through a first mesa conductor from a first contact pad, and the sensor signal output is coupled through a second mesa conductor to a second contact pad. Alternative configurations may include a pair of mesa-type structures formed with sloped sidewalls or vertical sidewalls adjacent to the respective contact pads on the integrated circuit substrate.

Another aspect of the present invention includes an infrared absorber assembly having a common layer of optical coating sensitive to infrared radiation and individual, separate layers of conductive material for each thermal sensor in the focal plane array. Each thermal sensor preferably has its own power supply electrode and sensor signal electrode. The focal plane array may be coupled to an integrated circuit substrate by bump-bonding, with bump-bonding conductive material (such as a bump-bonding metal) provided on the top of the mesa-type structures and on each power supply electrode and sensor signal electrode.

Another important technical advantage of the present invention includes providing a thermal sensor having a ferroelectric element with a power supply electrode and a sensor signal electrode formed on the same side of the ferroelectric element and varying the geometric configuration of the ferroelectric element between the power supply electrode and the sensor signal electrode to control the field effect of current flow between the two electrodes. By selecting the appropriate geometric configuration (for example a void space), the sensitivity of the ferroelectric element to infrared radiation may be increased while minimizing manufacturing time and cost for the ferroelectric element.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a schematic representation of a typical thermal circuit associated with a thermal imaging system or infrared detector having a thermal sensor formed from a ferroelectric element, an integrated circuit substrate and a thermal isolation structure disposed therebetween;

FIG. 2 is a schematic representation of the sensor signal flowpath associated with a thermal sensor incorporating one embodiment of the present invention;

FIG. 3 is a schematic plan view with portions broken away showing an infrared detector having a focal plane array, thermal isolation structure, and integrated circuit substrate incorporating an embodiment of the present invention corresponding with FIG. 2;

FIG. 4 is a drawing in section with portions broken away taken along line 4—4 of FIG. 3;

DETAILED DESCRIPTION OF THE INVENTION

Figure 5:
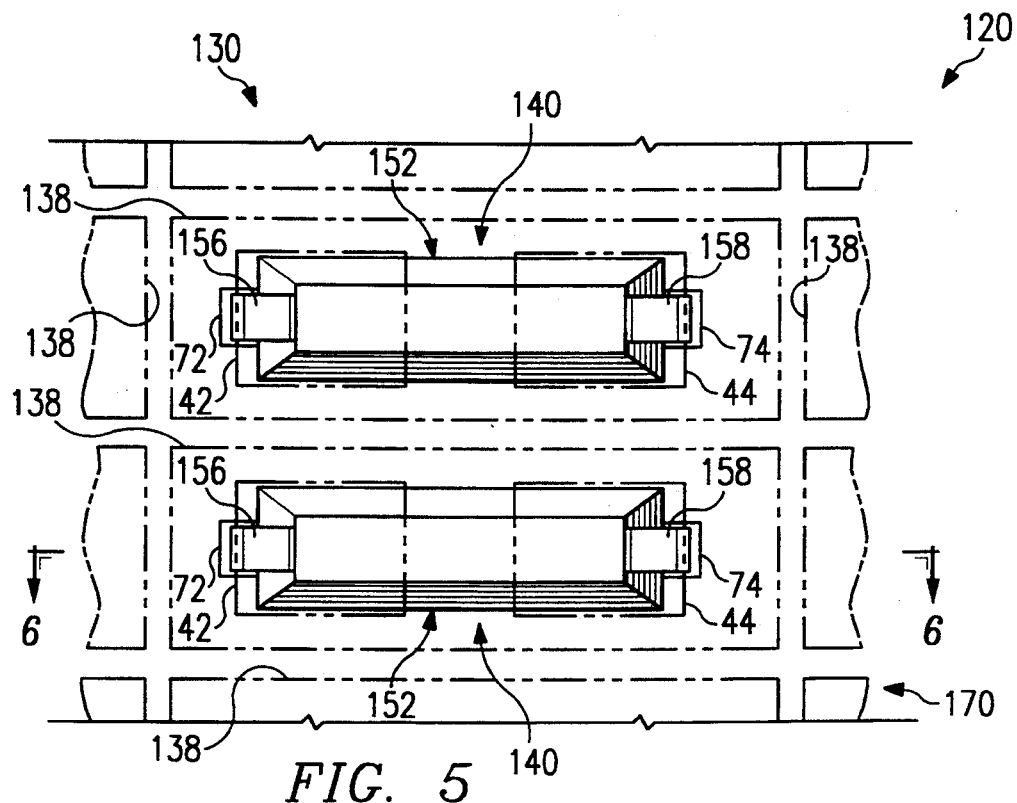
FIG. 5 is a schematic plan view with portions broken away showing an infrared detector having a focal plane array, thermal isolation structure, and integrated circuit substrate incorporating an alternative embodiment of the present invention corresponding with FIG. 2.

The preferred embodiments of the present invention and its advantages are best understood by referring to FIGS. 1-11 of the drawings, like numerals being used for like and corresponding parts of the various drawings.

Infrared detectors or thermal imaging systems are typically based upon either the generation of a change in voltage due to a change in temperature resulting from incident infrared radiation striking a thermal sensor or the generation of a change in voltage due to a photon-electron interaction within the material used to form the thermal sensor. This latter effect is sometimes called the internal photoelectric effect. Thermal imaging systems or infrared detectors 20, 120, 220 and 320, which will be described later in more detail, function based upon the generation of a change in voltage due to a change in temperature of ferroelectric material resulting from incident infrared radiation. Thermal imaging systems 20, 120, 220 and 320 are sometimes referred to as uncooled infrared detectors. The various components of thermal imaging systems 20, 120, 220 and 320 are preferably contained in associated housings (not shown) in a vacuum environment. Alternatively, an environment of low thermal conductivity gas may be satisfactory for some applications.

A thermal isolation structure associated with hybrid solid state systems often comprises two elements—an electrical conductor element and a thermal isolation element. As represented by thermal circuit 90 in FIG. 1, this general configuration for a thermal isolation structure can be represented by a thermal circuit with two parallel thermal current paths, one through a low-thermal-resistivity electrical conductor element and one through a high-thermal-resistivity thermal isolation element. One design goal is to minimize total thermal current flow through these two elements. By forming a focal plane array with discrete infrared absorber assemblies, thermal conduction between adjacent thermal sensors is reduced which improves MTF of the associated thermal imaging system.

Thermal circuit 90 is connected between sensor signal electrode 92 on ferroelectric element 94, and the associated contact pad 96 on integrated circuit substrate 98. A thermal current $i_T$ will flow through thermal circuit 90, in two parallel thermal current paths—an electrical conductor component $i_c$ flows through one or more mesa conductors having thermal resistance 100, and a mesa component $i_M$ which flows through one or more mesa-type structures represented by thermal resistance 102. By maximizing the total thermal resistance of thermal circuit 90, total thermal current $i_T = i_c + i_M$ is minimized.

Examples of previous thermal isolation structures are shown in U.S. Pat. No. 5,047,644 entitled *Polyimide Thermal Isolation Mesa for a Thermal Imaging System* to Meissner, et al. The fabrication techniques and the materials used in U.S. Pat. No. 5,047,644 may be used in fabricating thermal isolation structures 50 and 150 of the present invention. U.S. Pat. No. 5,047,644 is incorporated by reference for all purposes in this patent application.

Various types of semiconductor materials and integrated circuit substrates may also be satisfactorily used with the present invention. U.S. Pat. No. 4,143,269 entitled *Ferroelectric Imaging System* provides information concerning infrared detectors fabricated from ferroelectric materials and a silicon switching matrix or integrated circuit substrate. U.S. Pat No. 4,143,269 is incorporated by reference for all purposes in this patent application.

Thermal imaging system 20 and related fabrication methods will be described in detail. Thermal imaging systems 120, 220 and 320 represent alternative embodiments of the present invention. Various components may be alternatively used in each thermal imaging system 20, 120, 220 and 320. The written description of thermal imaging systems 120, 220 and 320 will be limited to describing differences between the respective thermal imaging system and thermal imaging system 20, including variations in their respective method of fabrication.

Figure 7:
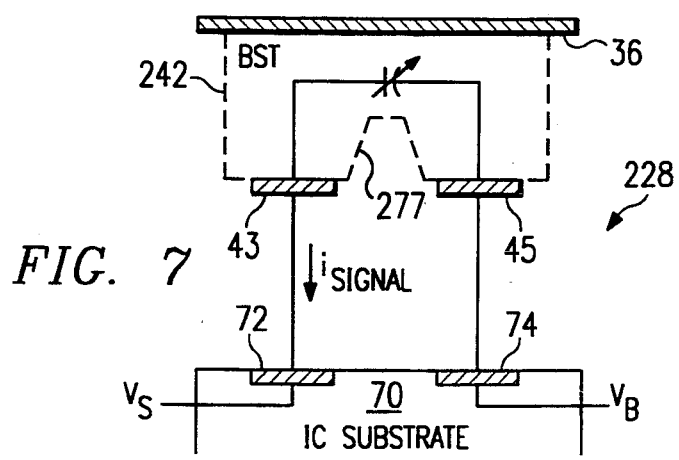
FIG. 7 is a schematic representation of the sensor signal flowpath associated with a thermal sensor incorporating another embodiment of the present invention.

FIG. 2 is a schematic representation of a sensor signal flowpath associated with embodiments of the present invention such as thermal imaging systems 20 and 120. FIG. 7 is a schematic representation of a sensor signal flowpath associated with other embodiments of the present invention such as thermal imaging systems 220 and 320.

Thermal imaging system 20 includes focal plane array 30 with a plurality of individual infrared absorber assemblies 32. Thermal imaging systems 120 includes focal plane array 130 with infrared absorber assembly 132. Infrared absorber assemblies 32 and 132 incorporating alternative embodiments of the present invention may be used with thermal imaging system 20, 120, 220 or 320 as desired. Thermal imaging system 20 includes a pair of ferroelectric elements 42 and 44 coupled respectively with each infrared absorber assembly 32. Thermal imaging system 120 includes a pair of ferroelectric elements 42 and 44 coupled to their respective plate or electrically conductive layer 36.

Thermal imaging systems 220 and 320 have the same focal plane array 230 including a plurality of infrared absorber assemblies 32 with ferroelectric elements 242 and 243 coupled respectively thereto. Ferroelectric elements 242 and 243 are similar except for the alternative configuration of void spaces 277 and 279 formed respectively therein.

Thermal imaging systems 20 and 220 have the same thermal isolation structure 50 including mesa-type structures 52 and 54 projecting from the same integrated circuit substrate 70. Thermal imaging systems 120 and 320 have the same thermal isolation structure 150 including mesa-type structures 152 projecting from the same integrated circuit substrate 170.

A schematic drawing showing sensor signal flowpath or electrical circuit 28 associated with one embodiment of the present invention is shown in FIG. 2. The principal components of sensor signal flowpath 28 include a pair of contact pads 72 and 74 on integrated circuit substrate 70 and ferroelectric elements 42 and 44 with their respective electrodes 43 and 45 and electrically conductive plate 36 extending across both ferroelectric elements 42 and 44. As will be explained later in more detail, various types of materials, both metallic and non-metallic, may be used to form plate 36. One of the design criteria in selecting the material for plate 36 is to ensure the desired electrical conductivity for current flow in the respective thermal sensor 40, 140, or 240. Other criteria for selecting the material to form plate 36 will be discussed later in more detail.

Integrated circuit substrate 70 supplies bias voltage or biasing voltage ($V_B$) to first contact pad or power supply pad 74 which flows to first electrode or power supply electrode 45. Incident infrared radiation will cause a temperature change in ferroelectric elements 42 and 44 resulting in a change in capacitance and polarization between plate 36 and electrodes 43 and 45, respectively. A signal corresponding to the incident infrared radiation will flow from ferroelectric element 42 through plate 36 to ferroelectric element 44. From ferroelectric element 44 the signal will flow from second electrode or sensor signal electrode 43 to second contact pad 72 on integrated circuit substrate 70. The sensor signal ($V_s$) is a function of the change in capacitance and polarization of ferroelectric elements 42 and 44 resulting from the incident infrared radiation. Therefore, ferroelectric elements 42 and 44 may be represented in sensor signal flowpath 28 as a pair of variable capacitors connected by plate 36. Thermal imaging systems 20 and 120 have similar sensor signal flowpaths which corresponds generally with the schematic circuit shown in FIG. 2.

Some of the principal components or structures which comprise thermal imaging system 20, as shown in FIGS. 3 and 4, include focal plane array 30, thermal isolation structure 50, and integrated circuit substrate 70. Focal plane array 30 comprises a plurality of thermal sensors 40. The quantity and location of thermal sensors 40 will depend upon the desired N×M configuration for focal plane array 30.

Thermal isolation structure 50 is used to provide mechanical support during bonding of focal plane array 30 with integrated circuit substrate 70 and to thermally insulate focal plane array 30 from integrated circuit substrate 70. For some embodiments of the present invention, thermal isolation structure 50 may be used to support focal plane array 30 during formation of Separate infrared absorber assemblies 32 associated with each thermal sensor 40. Also, thermal isolation structure 50 provides an electrical interface between each thermal sensor 40 in focal plane array 30 and integrated circuit substrate 70. The electrical interface allows integrated circuit substrate 70 to supply power to each thermal sensor 40 and to process thermal images based on incident infrared radiation detected by focal plane array 30.

Thermal imaging system 20 will produce a thermal image in response to incident infrared radiation striking focal plane array 30. The components of focal plane array 30 include a plurality of thermal sensors 40 and their respective infrared absorber assembly 32. Each thermal sensor 40 further comprises a pair of ferroelectric elements 42 and 44 with sensor signal electrode 43 and power supply electrode 45 respectively. One side of both ferroelectric elements 42 and 44 is attached to their associated infrared absorber assembly 32. Electrodes 43 and 45 are attached to the opposite side of their respective ferroelectric elements 42 and 44. Ferroelectric elements 42 and 44 may be formed from a suitable ferroelectric material, such as BST (barium-strontium-titanate).

Incident infrared radiation will interact with infrared absorber assemblies 32 and produce a temperature change in the attached ferroelectric elements 42 and 44. The temperature change will vary the electrical polarization and capacitance of the respective ferroelectric elements 42 and 44. The representative thermal image signal ($V_s$) appearing at each sensor signal electrode 43 will depend upon the polarization and capacitance of the associated ferroelectric elements 42 and 44, which in turn is a function of the incident infrared radiation. Ferroelectric elements 42 and 44 of focal plane array 30 are isolated thermally from adjacent thermal sensors 40 and from integrated circuit substrate 70 to insure that the capacitance and polarization associated with each thermal sensor 40 accurately represents the incident infrared radiation.

Each thermal sensor 40 in focal plane array 30 is individually coupled with integrated circuit substrate 70 by a pair of mesa-type structures 52 and 54 provided by thermal isolation structure 50. Each thermal sensor 40 is preferably connected electrically through its associated mesa-type structures 52 and 54 to a pair of corresponding contact pads 72 and 74 on integrated circuit substrate 70.

The thermal current flow through a material depends upon the thermal conductivity of the material and the volume of material (thermal capacitance). The size of each mesa-type structure 52 and 54 will be dictated primarily by structural and thermal capacitance considerations. Since mesa-type structures 52 and 54 exhibit very low thermal conductivity (i.e., very high thermal resistivity), the thermal-current mesa component $i_M$ through mesa-type structures 52 and 54 will typically depend upon structural requirements that determine the minimum allowable size of leach mesa-type structure 52 and 54.

Mesa strip conductors 56 and 58 which provide a portion of the sensor signal flowpath will inevitably exhibit a relatively low electrical resistivity and relatively high thermal conductivity. Accordingly, to increase the total thermal resistance provided by mesa strip conductors 56 and 58 and to minimize the corresponding thermal current conductor component $i_c$, mesa strip conductors 56 and 58 should be configured with as small a cross sectional area to length ratio as possible.

The recommended design approach is to first specify structural, sensor signal flowpath and thermal isolation requirements for thermal isolation structure 50, which will determine its total area and volume. Next the configuration for mesa-type structures 52 and 54 is selected and the associated thermal resistance established along with the corresponding thermal-current mesa component $i_M$. Once this thermal current component is established, a configuration for mesa strip conductors 56 and 58 may be selected to achieve an overall thermal resistance that meets the thermal isolation requirements for thermal imaging system 20. Design selection is typically a reiterative process during which the configuration of mesa-type structures 52 and 54 and mesa strip conductors 56 and 58 are varied to produce the desired structural integrity, sensor signal flowpath, and thermal isolation.

As shown in FIGS. 3 and 4, integrated circuit substrate 70 includes a corresponding array of contact pads 72 and 74. Thermal isolation structure 50 comprises an array of mesa-type structures 52 and 54, formed on integrated circuit substrate 70 adjacent to respective pairs of contact pads 72 and 74. Each thermal sensor 40 is preferably provided with the same bias voltage ($V_B$). Therefore, one or more common bus bars 76 may be formed on the surface of integrated circuit substrate 70 with a plurality of contact pads 74 positioned adjacent to each mesa-type structure 54. Contact pad 74, mesa-strip conductor 58 and power supply electrode 48 cooperate to supply bias voltage ($V_B$) to the associated ferroelectric element 44.

Each infrared absorber assembly 32 preferably comprises a layer of infrared absorber or optical coating 34 formed from infrared absorbing material and plate 36. For some applications layer 34 may include multiple layers of infrared sensitive material depending upon the specific wavelength or wavelengths of infrared radiation that thermal sensor 40 is designed to detect. Plate 36 may perform several important functions such as increasing the interaction of incident infrared radiation with optical coating 34. Plate 36 is preferably electrically conductive to form a portion of the sensor signal flowpath between ferroelectric elements 42 and 44. Also, plate 36 preferably has high thermal conductivity to allow rapid transfer of heat energy from optical coating 34 to the attached ferroelectric elements 42 and 42.

For one embodiment of the present invention, plate 36 may be formed from metal such as nickel which has both good thermal and electrical conductivity and cooperates with optical coating 34 to enhance the absorption of incident infrared radiation. For other embodiments of the present invention, materials other than metal which have the desired characteristics may be used to form plate 36. The present invention is not limited to use with only metal plates 36.

Metallic bonding material 46 is preferably provided on sensor signal electrode 43 to form a bump bond with similar metallic bonding material 62 on associated mesa-type structure 52. In a similar manner metallic bonding material 48 is preferably provided on power supply electrode 45 for bump bonding with metallic bonding material 64 on mesa-type structure 54. For some applications epoxy bonding may be satisfactorily used to mount thermal sensors 40 on their associated mesa-type structures 52 and 54.

For each thermal sensor 40, ferroelectric elements 42 and 44, infrared absorber assembly 32 and the respective electrodes 43 and 45 define a ferroelectric transducer. That is, power supply electrode 45 and sensor signal electrode 43 constitute capacitor plates, while ferroelectric elements 42 and 44 constitute dielectrics electrically coupled to each other by plate 36 of infrared absorber assembly 32. The resulting capacitance and polarization is temperature-dependent, implementing a ferroelectric (or pyroelectric) transducer function. The associated Modulation Transfer Function (MTF) is substantially enhanced by thermal isolation structure 50 and infrared absorber assembly 32 incorporating the present invention.

For each thermal sensor 40, thermal (infrared) radiation incident to focal plane array 30 is absorbed by the respective infrared absorber or optical coating 34 and transmitted as heat through plate 36 into the adjacent ferroelectric elements 42 and 44. The resulting temperature change in the ferroelectric elements 42 and 44 causes a change in the state of electrical polarization and capacitance. The corresponding sensor signal output available from the sensor signal electrode 43 depends upon the capacitance and polarization of the respective ferroelectric transducer (i.e., thermal sensor 40).

Integrated circuit substrate 70 comprises a conventional switching matrix and associated series of amplifiers. Integrated circuit substrate 70 is bonded to focal plane array 30, with each pair of contact pads 72 and 74 being electrically connected to the corresponding sensor signal electrode 43 and power supply electrode 45 of an associated thermal sensor 40. Thermal isolation structure 50 prevents the integrated circuit substrate 70 from acting as a heat sink for the thermal energy stored in ferroelectric elements 42 and 44 of each thermal sensor 40 and adversely affecting the associated transducer capacitance and sensor signal accuracy.

Mesa strip conductor 56 provides a signal path between the top of each mesa-type structure 52 and the adjacent contact pad 72. Mesa strip conductor 58 provides an electrical path from the adjacent contact pad 74 to the top of each mesa-type structure 54. Recommended materials for the mesa strip conductors 56 and 58 include titanium and tungsten alloys because of their relatively low thermal conductivity and ease of application.

Indium bump bonding techniques may be satisfactorily used to form metal bonds between focal plane array 30 and thermal isolation structure 50. The configurations of mesa-type structures 52 and 54 and the associated mesa strip conductors 56 and 58 are design choices, largely dependent upon thermal isolation and structural rigidity considerations. Alternative configurations for mesas 52 and 54 include mesas with sloping sidewalls and mesas with vertical sidewalls. For sloped sidewall mesas 52 and 54, a mesa strip configuration for the conductors 56 and 58 is recommended. For a vertical sidewall mesa, a mesa-contour configuration as shown in U.S. Pat. No. 5,047,644 may be more appropriate. These configurations are exemplary only, and other configurations for both the mesa-type structures 52 and 54 and their associated conductors 56 and 58 will be apparent to those skilled in the art. In particular, while mesa-type structures 52 and 54 are shown as symmetrical in horizontal and vertical cross section, such symmetry is not required.

Mesa-type structures 52 and 54 of the present invention, including the exemplary thermal isolation structure 50 for thermal imaging systems 20 and 220, may be fabricated using conventional photolithographic techniques. Fabrication methods using photosensitive polyimide are described. However, for some applications, non-photosensitive polyimide may be used. Fabrication using photosensitive polyimide is recommended, because it generally requires fewer process steps.

One fabrication method is to use photosensitive polyimide, forming the mesa structures by patterning a layer of photoresist on polyimide, and then developing the polyimide to remove the unexposed portions, leaving the polyimide portion of the mesa structure with the desired configuration and array. The mesa conductors may then be formed in conventional metal deposition procedures on the exterior of the polyimide structure.

Once the array of mesa-type structures 52 and 54 have been defined, the selected mesa strip conductors 56 and 58 are formed using conventional photolithography techniques on the exterior of the respective mesas 52 and 54. Mesa strip conductors 56 and 58 are preferably formed on the exterior of their respective mesa-type structures 52 and 54 to extend from the top of the respective mesa-type structure 52 and 54 to the respective contact pads 72 and 74.

Additional fabrication steps may be employed to deposit bump-bond metals 62 and 64 or conductive epoxies (not shown) on the top of mesa-type structures 52 and 54 as desired. These additional fabrication steps are accomplished conventionally, with conventional materials the selection of which depends upon the specific application for thermal isolation structure 50 of the present invention.

Focal plane array 30 may be bonded to integrated circuit substrate 70 by using bump bonding or other conventional techniques to mount thermal sensors 40 on thermal isolation structure 50. During this bonding process, mesa-type structures 52 and 54 provide the necessary mechanical support for the selected bonding process. Following the bonding of focal plane array 30 with integrated circuit substrate 70, various techniques may be used to form a plurality of slots 38 around the perimeter of each infrared absorber assembly 32. For some applications, slots 38 may be formed prior to bump bonding focal plane array 30 with integrated circuit substrate 70.

Slots 38 form void spaces between adjacent infrared absorber assemblies 32 which prevent the transfer of thermal energy from adjacent thermal sensors 40 through infrared absorber assembly 32. Slots 38 substantially enhance the thermal isolation of each thermal sensor 40 particularly when the associated thermal imaging system is disposed in a vacuum environment. Slots 38 may be formed by photolithography or other techniques associated with fabrication of semiconductor devices.

Figure 6:
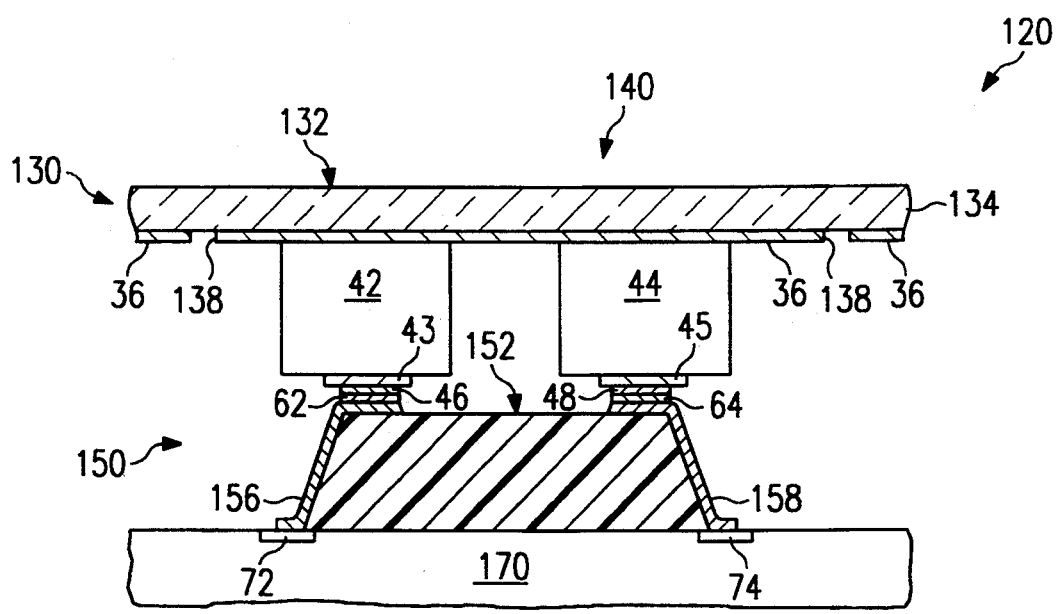
FIG. 6 is a drawing in section with portions broken away taken along lines 6—6 of FIG. 5 showing an infrared absorber assembly with a common layer of optical coating sensitive to infrared radiation and separate, individual layers of conductive material for each thermal sensor.

FIGS. 5 and 6 illustrate an alternative embodiment of the present invention in which thermal imaging system 120 comprises focal plane array 130, a plurality of thermal sensor 140, thermal isolation structure 150 and integrated circuit substrate 170. Thermal sensors 140 are generally similar to thermal sensors 40 except for infrared absorber assembly 132 which will be described later in more detail. As previously noted for thermal imaging system 20, the various components of thermal imaging system 120 are preferably disposed in a vacuum or low thermal conductivity gas environment.

Thermal isolation structure 150 is provided to mount thermal sensors 140 of focal plane array 130 on integrated circuit substrate 170. Thermal isolation structure 150 includes a plurality of mesa-type structures 152 which may be coupled with their respective thermal sensor 140. For selected applications forming a single mesa-type structure 152 may be more cost effective as compared to forming a pair of mesa-type structures 52 and 54. As previously noted, designing a focal plane array, ferroelectric elements and a thermal isolation structure is typically a reiterative process. Thermal isolation structure 150 with mesa-type structures 152 is formed in a manner similar to thermal isolation structure 50.

Mesa strip conductors 156 and 158 are formed on the exterior of mesa-type structure 152 adjacent to the associated pair of contact pads 72 and 74. Integrated circuit substrate 170 is similar to integrated circuit substrate 70 except common bus bars 76 have been eliminated. By providing an array of individual power supply contact pad 74, integrated circuit substrate 170 allows the option of varying the bias voltage $(V_B)$ supplied to each thermal sensor 140. As previously noted, normally the same bias voltage $(V_B)$ is provided to each thermal sensor 140. However, for some applications particularly very large arrays, it may be desirable to vary the bias voltage $(V_B)$ supplied to each thermal sensor 40.

Integrated circuit substrate 170 provides two electrical contact pads 72 and 74. A pair of mesa strip conductors 156 and 158 are provided on each mesa-type structure 152. Mesa strip conductor 158 provides bias voltage $(V_B)$ from contact pad 74 to allow ferroelectric elements 42 and 44 and electrodes 43 and 45 to function as a capacitor.

A further embodiment of the present invention is represented by focal plane array 130 having infrared absorber assembly 132 as shown in FIGS. 5 and 6. Infrared absorber assembly 132 comprises one or more layers of infrared absorber or optical coating 134 which extends across the full surface of focal plane array 130. A plurality of layers of conductive material 36 are disposed between and attached to infrared absorber layer 134 and the respective ferroelectric elements 42 and 44 as shown in FIG. 6. Slots 138 are provided around the perimeter of each adjacent conductive layer 36. However, slots 138 do not extend through infrared absorber layer 134. One of the principal differences between infrared absorber assembly 32 and infrared absorber assembly 132 is slots 138 provided between adjacent conductive layers 36 but not extending through infrared absorber layer 134. Slots 138 may be formed by various techniques associated with semiconductor fabrication. Layers 36 may be formed from various types of metal and other electrically conductive materials.

Focal plane array 130 with infrared absorber assembly 132 may be used in fabricating thermal imaging systems 20, 120, 220, and 320 as desired. Since slots 138 are only formed between adjacent plates 36, there may be some additional thermal current flow through infrared absorber layer 134 as compared to the thermal current flow associated with infrared absorber assemblies 32 and their respective infrared absorber layer 34. The use of either infrared absorber assembly 32 or 132 depends upon various factors related to the overall design and manufacture of the associated thermal imaging system.

A schematic drawing showing sensor signal flowpath or electrical circuit 228 associated with another embodiment of the present invention is shown in FIG. 7. The principal components of sensor signal flowpath 228 include a pair of contact pads 72 and 74 on integrated circuit substrate 70 and ferroelectric element 242 with sensor signal electrode 43 and power supply electrode 45. Integrated circuit substrate 70 supplies bias voltage ($V_B$) to first contact pad or power supply pad 74 which flows to first electrode or power supply electrode 45. Incident infrared radiation will cause a temperature change in ferroelectric element 242 resulting in a change in capacitance between electrodes 43 and 45. For some applications, void space 277 is formed between electrodes 43 and 45 to control the field effect of current flow between these electrodes. Layer 36 is preferably formed from electrically conductive material to assist with maintaining the desired current flow path between electrodes 43 and 45. For some applications, layer 36 may be formed from non-conductive material or even eliminated depending upon the desired current flow path in the associated ferroelectric element 242.

A signal corresponding to the incident infrared radiation will flow from second electrode or sensor signal electrode 43 to second contact pad 72 on integrated circuit substrate 70. The sensor signal ($V_S$) is a function of the change in polarization and capacitance of ferroelectric element 242 resulting from the incident infrared radiation. Therefore, ferroelectric element 242 may be represented as a variable capacitor in sensor signal flowpath 228. Thermal imaging systems 220 and 320 have similar sensor signal flowpaths which correspond generally with the schematic circuit shown in FIG. 7.

Some of the principal components or structures which comprise thermal imaging system 220 include focal plane array 230, thermal isolation structure 50, and integrated circuit substrate 70. Focal plane array 230 comprises a plurality of thermal sensors 240. The quantity and location of thermal sensors 240 will depend upon the desired N×M configuration for focal plane array 230. Thermal isolation structure 50 and integrated circuit substrate 70 are essentially the same as previously described for thermal imaging system 20.

Thermal isolation structure 50 provides an electrical interface between each thermal sensor 240 in focal plane array 230 and integrated circuit substrate 70. The electrical interface allows integrated circuit substrate 70 to supply power to each thermal sensor 240 and to process thermal images based on incident infrared radiation detected by focal plane array 230.

Figure 8:
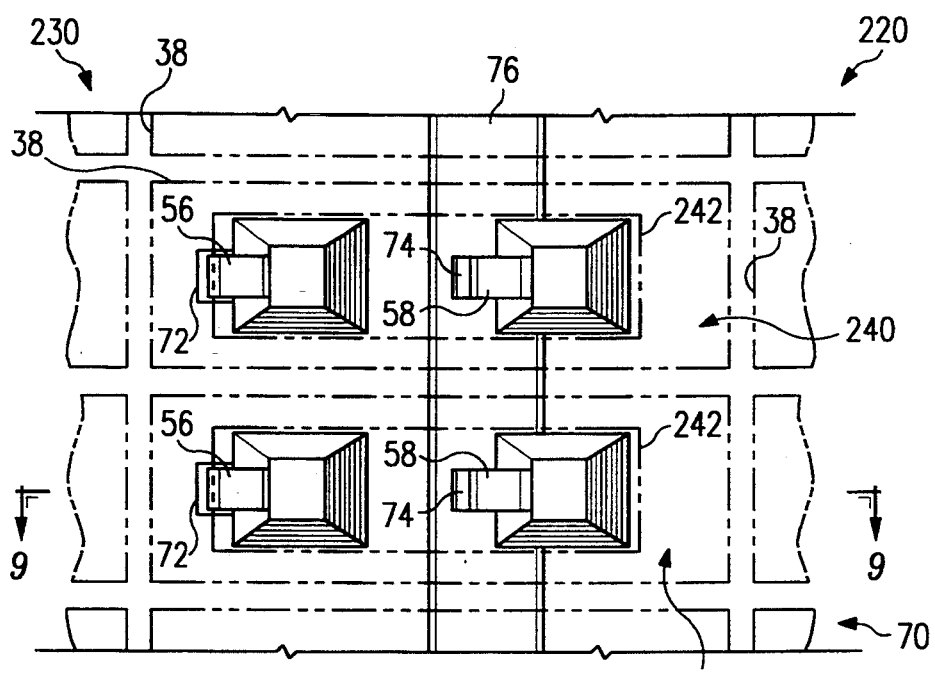
FIG. 8 is a schematic plan view with portions broken away showing an infrared detector having a focal plane array, thermal isolation structure, and integrated circuit substrate incorporating an embodiment of the present invention corresponding generally with FIG. 7.
Figure 9:
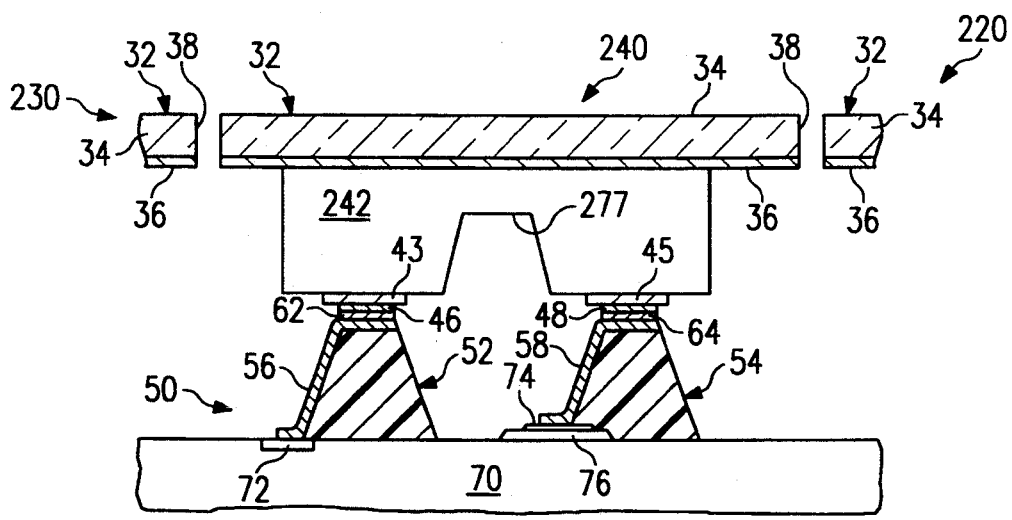
FIG. 9 is a drawing in section with portions broken away taken along line 9—9 of FIG. 8 showing a thermal sensor having a ferroelectric element with a first type of void space for controlling the field effect of current flow between the thermal sensor's power supply electrode and sensor signal electrode.

Thermal imaging system 220, as shown in FIGS. 8 and 9, will produce a thermal image in response to incident infrared radiation striking focal plane array 230. The components of focal plane array 230 include a plurality of thermal sensors 240 and their respective infrared absorber assembly 32. Each thermal sensor 240 further comprises a single ferroelectric element 242 with sensor signal electrode 43 and power supply electrode 45 respectively. One side of each ferroelectric element 242 is attached to the associated infrared absorber assembly 32. Electrodes 43 and 45 are attached to the opposite side of each ferroelectric element 242 and spaced apart from each other.

Ferroelectric elements 242 may be formed from a suitable ferroelectric material, such as BST (barium-strontium-titanate). Void space 277 is preferably formed in ferroelectric element 242 between electrodes 43 and 45. The configuration and design of void space 277 is selected to control the field effect of current flow between power supply electrode 45 and sensor signal electrode 43. By forming void space 277 in ferroelectric element 242, the sensitivity of thermal sensor 240 to incident infrared radiation may be substantially increased. Plate 36 cooperates with void space 277 to establish the desired sensor signal flowpath through the associated ferroelectric element 242. For some applications it may be more cost effective to form a single ferroelectric element 242 with void space 277 as compared to a pair of ferroelectric elements 42 and 44.

Incident infrared radiation will produce a temperature change in each ferroelectric element 242 which changes its electrical polarization and capacitance. The representative thermal image signal appearing on each sensor signal electrode 43 will depend upon the polarization and capacitance of the associated ferroelectric element 242, which in turn is a function of the incident infrared radiation. Ferroelectric element 242 of focal plane array 230 are isolated thermally from adjacent thermal sensors 240 and from integrated circuit substrate 70 to insure that the capacitance polarization associated with each thermal sensor 240 accurately represents the incident infrared radiation. Void space 277 is provided to control undesired field effect current flow between electrodes 43 and 45.

Each thermal sensor 240 in the focal plane array 230 is coupled with integrated circuit substrate 70 by a pair of mesa-type structures 52 and 54 provided by thermal isolation structure 50. Each thermal sensor 240 is preferably connected electrically through its associated mesa-type structures 52 and 54 to corresponding contact pads 72 and 74 on integrated circuit substrate 70. Mesa strip conductors 56 and 58 provide a portion of the sensor signal flowpath and function as previously described for thermal imaging system 20. The configuration of mesa strip conductors 56 and 58 may be selected to achieve an overall thermal resistance that meets the thermal isolation requirements for thermal imaging system 220. As previously noted, design selection is typically a reiterative process during which the configuration of mesa-type structures 52 and 54 and mesa strip conductors 56 and 58 are varied to produce the desired structural integrity, sensor signal flowpath, and thermal isolation.

For each thermal sensor 240, ferroelectric element 242, infrared absorber assembly 32 and the respective electrodes 43 and 45 define a ferroelectric transducer. That is, power supply electrode 45 and sensor signal electrode 43 constitute capacitor plates, while ferroelectric element 242 constitutes a dielectric. The resulting capacitance and polarization are temperature-dependent, implementing a ferroelectric (or pyroelectric) transducer function. The associated MTF is substantially enhanced by thermal isolation structure 50 and infrared absorber assembly 32 incorporating the present invention.

For each thermal sensor 240, thermal (infrared) radiation incident to focal plane array 230 is absorbed by the respective infrared absorber or optical coating 34 and transmitted as heat through plate 36 into the adjacent ferroelectric element 242. The resulting temperature change in ferroelectric element 242 causes a change in the state of electrical polarization and capacitance. The corresponding sensor signal output available from the sensor signal electrode 43 depends upon the capacitance and polarization of the respective ferroelectric transducer (i.e., thermal sensor 240).

Integrated circuit substrate 70 is bonded to focal plane array 230, with each pair of contact pads 72 and 74 being electrically connected to the corresponding sensor signal electrode 43 and power supply electrode 45 of an associated thermal sensor 240. Thermal isolation structure 50 prevents integrated circuit substrate 70 from acting as a heat sink for the thermal energy stored in ferroelectric element 242 of each thermal sensor 40 and adversely affecting the associated transducer capacitance and sensor signal accuracy.

Figure 10:
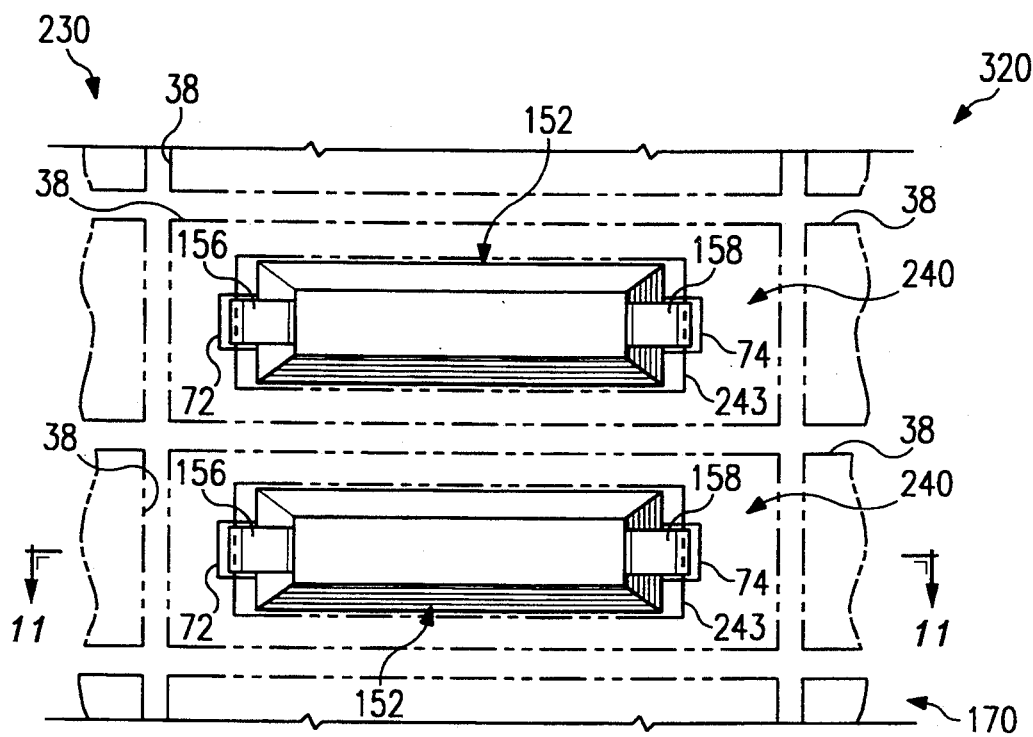
FIG. 10 is a schematic plan view with portions broken away showing an infrared detector having a focal plane array, thermal isolation structure, and integrated circuit substrate incorporating an alternative embodiment of the present invention corresponding with FIG. 7.
Figure 11:
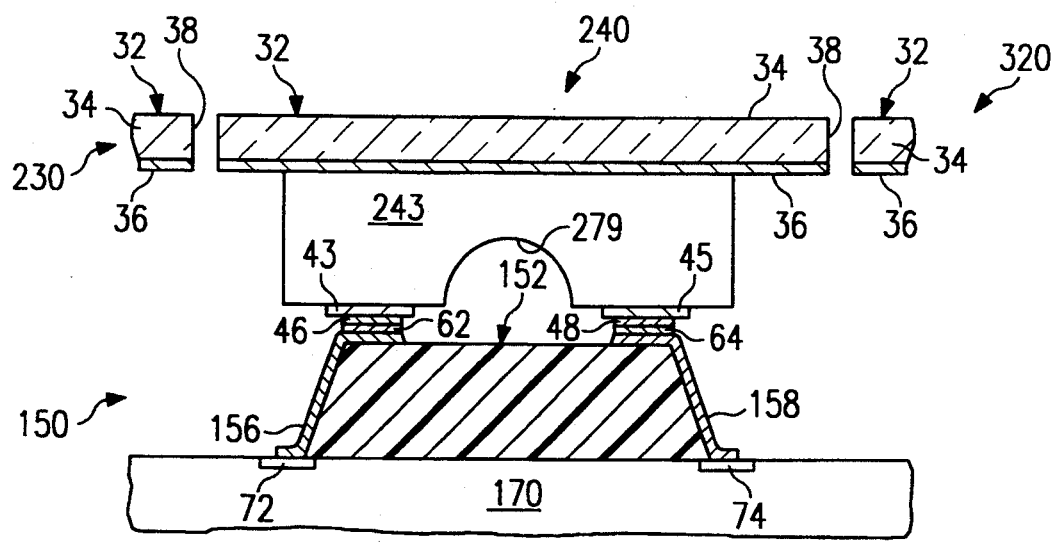
FIG. 11 is a drawing in section with portions broken away taken along lines 11—11 of FIG. 10 showing a thermal sensor having a ferroelectric element with a second type of void space for controlling the field effect of current flow between the thermal sensor's power supply electrode and sensor signal electrode.

As shown in FIGS. 10 and 11, thermal imaging system 320 includes focal plane array 230 of individual thermal sensors or infrared detector elements 240, together with thermal isolation structure 150 and integrated circuit substrate 170. For thermal imaging system 320, each thermal sensor 240 includes a single ferroelectric element 243. Ferroelectric elements 242 and 243 are essentially identical except for the configuration of their respective void spaces 277 and 279. As previously noted, the configuration of void spaces 277 and 279 may be designed to provide the optimum sensor signal flowpath with respect to the associated thermal sensor 240. The configuration and dimensions of void spaces 277 and 279 depend upon various factors such as the dimensions of the associated ferroelectric element, the bias voltage ($V_B$) supplied to electrode 45, the electrical conductivity of plate 36 and the sensitivity of infrared absorber assembly 230 to incident infrared radiation.

Thermal isolation structure 150 comprises an array of mesa-type structure 152, formed on integrated circuit substrate 170 adjacent to respective pairs of contact pads 72 and 74. Thermal isolation structure 150 provides mechanical support during bonding of focal plane array 230 with integrated circuit substrate 170, electrical connections between each thermal sensor 240 and its associated contact pads 72 and 74 and thermal isolation between each thermal sensor 240 and integrated circuit substrate 170.

The precise structural configuration, and associated fabrication methods for ferroelectric elements 42, 44, 242, and 243 and mesa-type structures 52, 54 and 152 in accordance with the present invention are dependent upon the application chosen for the resulting thermal sensor 40, 140 and 240. Even within a particular application, such as the exemplary thermal imaging systems 20, 120, 220 and 320, numerous design choices will be routinely implemented by those skilled in the art.

Thermal imaging systems 20, 120, 220 and 320 are examples of hybrid solid state systems with component structures and substrates electrically and mechanically coupled to each other. The present invention may be used to provide thermal isolation and/or electrical connections for various types of hybrid solid state systems in addition to thermal imaging systems.

Although the present invention and its advantages have been described in detail, it should be understood that various changes, substitutions and alterations can be made therein without departing from the spirit and scope of the invention as defined by the appended claims.

What is claimed is:

1. An infrared detector including a focal plane array and an integrated circuit substrate, comprising:
   a plurality of thermal sensors for providing a sensor signal output representative of the amount of thermal radiation incident to the focal plane array;
   an infrared absorber assembly coupled to one side of each thermal sensor and the integrated circuit substrate coupled to the opposite side of each thermal sensor;
   the infrared absorber assembly having a layer of optical coating sensitive to infrared radiation disposed on a layer of electrically conductive material;
   a plurality of slots formed in the layer of electrically conductive material between adjacent thermal sensors to provide electrical isolation between the adjacent thermal sensors;
   an array of contact pads, disposed on the integrated circuit substrate, for receiving the sensor signal output from the respective thermal sensors; and
   a thermal isolation structure formed by a plurality of mesa-type structures projecting from the integrated circuit substrate for coupling the respective thermal sensors with the integrated circuit substrate, wherein each mesa-type structure is adjacent to one or more of the respective contact pads.

2. The detector of claim 1, wherein the focal plane array further comprises:
   each thermal sensor having a single ferroelectric element;
   the infrared absorber assembly attached to one side of each ferroelectric element;
   a power supply electrode and a sensor signal electrode attached to the opposite side of each ferroelectric element; and
   a void space formed in each ferroelectric element between the associated power supply electrode and sensor signal electrode.

3. The detector of claim 1, wherein the focal plane array further comprises:
   each thermal sensor having a pair of ferroelectric elements;
   the infrared absorber assembly attached to one side of both ferroelectric elements;
   a power supply electrode attached to the opposite side of one ferroelectric element of each thermal sensor;
   a sensor signal electrode attached to the opposite side of the other ferroelectric element of each thermal sensor; and each electrode coupled with an associated mesa-type structure provided by the thermal isolation structure.

4. The detector of claim 1, wherein the focal plane array further comprises:
each thermal sensor having a single ferroelectric element;
the respective infrared absorber assembly attached to one side of each ferroelectric element;
a power supply electrode and a sensor signal electrode attached to the opposite side of each ferroelectric element; and
each electrode coupled with a respective mesa-type structure provided by the thermal isolation structure.

5. The detector of claim 1, wherein the focal plane array further comprises:
each thermal sensor having at least one ferroelectric element with the respective infrared absorber assembly coupled with one side of each ferroelectric element and at least one electrode coupled with the opposite side of the respective ferroelectric element;
a plurality of slots extending through the layer of optical coating corresponding with the slots in the layer of electrically conductive material formed between each infrared absorber assembly; and
the focal plane array disposed in a vacuum environment.

6. The detector of claim 1, wherein the focal plane array further comprises:
each thermal sensor having at least one ferroelectric element with the respective infrared absorber assembly coupled with one side of each ferroelectric element and at least one electrode coupled with the opposite side of the respective ferroelectric element;
a plurality of slots extending through the layer of optical coating corresponding with the slots in the layer of electrically conductive material formed between each infrared absorber assembly; and
the focal plane array disposed in a low thermal conductivity gas environment.

7. The detector of claim 1, wherein the focal plane array further comprises:
the layer of optical coating sensitive to infrared radiation disposed on a plurality of electrically conductive metal plates;
each thermal sensor having a pair of ferroelectric elements with one side of each ferroelectric elements coupled with a respective metal plate;
a power supply electrode coupled with the opposite side of one ferroelectric element;
a sensor signal electrode coupled with the opposite side of the other ferroelectric element; and
the respective metal plate for each thermal sensor providing an electrical connection between the associated pair of ferroelectric elements.

8. A focal plane array, comprising:
an array of thermal sensors for detecting incident thermal radiation, each thermal sensor providing a sensor signal output representative of the amount of the thermal radiation incident to the respective thermal sensor and each thermal sensor isolated electrically and thermally from adjacent thermal sensors;
an integrated circuit substrate having an array of contact pads disposed on a substantially planar surface for supplying power to each thermal sensor and receiving the sensor signal output from the respective thermal sensor;
an array of mesa-type structures projecting from the substantially planar surface of the integrated circuit substrate, at least one mesa-type structure being disposed adjacent to each contact pad;
a first mesa conductor for supplying power to each thermal sensor from a corresponding first contact pad;
a second mesa conductor for providing a signal flowpath between each thermal sensor and a corresponding second contact pad;
each mesa conductor extending from the top of the respective mesa-type structure to the adjacent area of the integrated circuit substrate having the corresponding contact pad;
the thermal sensor array being disposed over the integrated circuit substrate in contact with the array of mesa-type structures such that, the power supply for each thermal sensor is coupled from the corresponding first contact pad through the respective first mesa conductor and the sensor signal output is coupled through the respective second mesa conductor to the corresponding second contact pad; and
each thermal sensor having a single ferroelectric element with a void space formed therein.

9. The focal plane array of claim 8, wherein the array of thermal sensors further comprises:
each thermal sensor coupled to a respective infrared absorber assembly; and
a plurality of slots extending between each infrared absorber assembly and adjacent thermal sensors.

10. The focal plane array of claim 8, wherein the array of thermal sensors further comprises:
an infrared absorber assembly having a layer of optical coating sensitive to infrared radiation disposed on a layer of conductive material;
the infrared absorber assembly coupled with one side of the ferroelectric element; and
a pair of electrodes coupled with the opposite side of each ferroelectric element.

11. The focal plane array of claim 8, wherein the array of thermal sensors further comprises:
a power supply electrode and a sensor signal electrode attached to the side of each ferroelectric element opposite from the infrared absorber assembly; and
the void space formed in each ferroelectric element between the associated power supply electrode and sensor signal electrode.

12. The focal plane array of claim 8, wherein the array of thermal sensors further comprises:
the infrared absorber assembly having a metal plate attached to one side of each ferroelectric element;
a power supply electrode and a sensor signal electrode attached to the opposite side of each ferroelectric element; and
the void space formed in each ferroelectric element between the associated power supply electrode and sensor signal electrode.

13. The focal plane array of claim 8, wherein the array of thermal sensors further comprises:
a plurality of infrared absorber assemblies each having a layer of optical coating sensitive to infrared radiation disposed on a layer of conductive material;

a power supply electrode and a sensor signal electrode attached to the side of each ferroelectric element opposite from the infrared absorber assembly;

the void space formed in each ferroelectric element between the associated power supply electrode and sensor signal electrode; and each infrared absorber assembly separated from adjacent infrared absorber assemblies.

14. A method of fabricating a thermal imaging system having a focal plane array mounted on an integrated circuit substrate with a thermal isolation structure disposed therebetween, comprising the steps of:

forming a plurality of ferroelectric elements with a void space extending partially through each ferroelectric element;

coupling an infrared absorber assembly with the ferroelectric elements to provide a plurality of thermal sensors with each sensor having a sensor signal output representative of thermal radiation incident to the infrared absorber assembly;

providing the integrated circuit substrate with an array of first contact pads for supplying power to the respective ferroelectric elements;

providing the integrated circuit substrate with an array of second contact pads for receiving the sensor signal output from the respective ferroelectric elements;

forming a plurality of mesa-type structures projecting from the integrated circuit substrate to provide a portion of the thermal isolation structure, wherein each mesa-type structure is adjacent to one or more of the respective contact pads; and mounting the focal plane array on the thermal isolation structure to establish a sensor signal flow path for each thermal sensor.

15. The method of fabricating the thermal imaging system as defined in claim 14, further comprising the step of forming a plurality of slots extending through the focal plane array intermediate the respective thermal sensors.

16. The method of fabricating the thermal imaging system as defined in claim 14, further comprising the steps of:

forming the mesa-type structures with a plurality of polyimide mesas;

mounting the focal plane array on the mesa-type structures; and forming a plurality of slots in the focal plane array intermediate each thermal sensor.

17. The method of fabricating the thermal imaging system as defined in claim 14, further comprising the steps of:

placing a first electrode on each ferroelectric element for receiving power from the integrated circuit substrate;

placing a second electrode on each ferroelectric element for supplying the sensor signal output to the integrated circuit substrate;

forming the void space between the first electrode and the second electrode; and coupling each electrode with a respective mesa-type structure.

18. The method of fabricating the thermal imaging system as defined in claim 14, wherein forming the focal plane array further comprises the steps of:

placing a layer of optical coating sensitive to infrared radiation on a non-metallic plate; and forming a plurality of slots extending through the non-metallic plate to provide electrical isolation between the respective thermal sensors.

19. The method of fabricating the thermal imaging system as defined in claim 14, wherein forming the focal plane array further comprises the steps of:

placing a layer of optical coating sensitive to infrared radiation on a metal plate; and forming a plurality of slots extending through the metal plate to provide electrical isolation between the respective thermal sensors.

20. The method of fabricating the thermal imaging system as defined in claim 14, wherein forming the focal plane array further comprises the steps of:

placing a layer of optical coating sensitive to infrared radiation on a metal plate; and forming a plurality of slots extending through the metal plate and the optical coating layer to provide thermal isolation and electrical isolation between the respective thermal sensors.

* * * * *